(12) United States Patent
Shah et al.

(10) Patent No.: US 10,486,713 B2
(45) Date of Patent: Nov. 26, 2019

(54) DYNAMIC STUCK SWITCH MONITORING

(71) Applicants: Ankit Shah, Canton, MI (US); Hirak Chanda, Troy, MI (US)

(72) Inventors: Ankit Shah, Canton, MI (US); Hirak Chanda, Troy, MI (US)

(73) Assignee: Robert Bosch GmbH, Stuttgart (DE)

(*) Notice: Subject to any disclaimer, the term of this patent is extended or adjusted under 35 U.S.C. 154(b) by 324 days.

(21) Appl. No.: 15/328,821

(22) PCT Filed: Aug. 8, 2014

(86) PCT No.: PCT/US2014/050266
§ 371 (c)(1),
(2) Date: Jan. 24, 2017

(87) PCT Pub. No.: WO2016/022141
PCT Pub. Date: Feb. 11, 2016

(65) Prior Publication Data
US 2017/0210392 A1    Jul. 27, 2017

(51) Int. Cl.
*B60W 50/02* (2012.01)
*B60W 50/14* (2012.01)
(Continued)

(52) U.S. Cl.
CPC ........ *B60W 50/0205* (2013.01); *B60W 50/14* (2013.01); *G01R 31/007* (2013.01);
(Continued)

(58) Field of Classification Search
CPC ............. B60W 50/0205; B60W 50/14; B60W 2710/18; B60W 2720/106;
(Continued)

(56) References Cited

U.S. PATENT DOCUMENTS 6,415,657 B1 * 7/2002 Bortolin ................... F02P 11/02
324/378
7,446,428 B2 * 11/2008 Sugimura .......... G01R 31/3278
307/10.6
(Continued)

FOREIGN PATENT DOCUMENTS

CN          101336463 A       12/2008
CN          102463905 A        5/2012
(Continued)

OTHER PUBLICATIONS

International Search Report and Written Opinion for Application No. PCT/US2014/050266 dated Apr. 20, 2015 (9 pages).

*Primary Examiner* — Muhammad Shafi
(74) *Attorney, Agent, or Firm* — Michael Best & Friedrich LLP

(57) ABSTRACT

Methods and systems for monitoring a switch included in a vehicle. One method includes a method of monitoring a switch included in a vehicle. The method includes obtaining a current vehicle speed, and dynamically, by a controller, generating a duration for detecting a stuck state of the switch based on at least the current vehicle speed, detecting, by the controller, a duration of a high signal received from the switch. The method also includes comparing, by the controller, the duration of the high signal to the generated duration, and detecting, by the controller a stuck state of the switch when the duration of the high signal satisfies the generated duration.

18 Claims, 17 Drawing Sheets

(51) Int. Cl.
  *G01R 31/327* (2006.01)
  *G01R 31/00* (2006.01)
  *F16H 61/12* (2010.01)

(52) U.S. Cl.
  CPC ..... *G01R 31/3275* (2013.01); *G01R 31/3277* (2013.01); *B60W 2050/021* (2013.01); *B60W 2050/143* (2013.01); *B60W 2050/146* (2013.01); *B60W 2510/1005* (2013.01); *B60W 2510/18* (2013.01); *B60W 2520/10* (2013.01); *B60W 2520/105* (2013.01); *B60W 2520/14* (2013.01); *B60W 2550/142* (2013.01); *B60W 2710/1005* (2013.01); *B60W 2710/18* (2013.01); *B60W 2720/106* (2013.01); *B60W 2720/14* (2013.01); *B60Y 2300/181* (2013.01); *B60Y 2300/18116* (2013.01); *F16H 2061/1208* (2013.01); *F16H 2061/1216* (2013.01)

(58) Field of Classification Search
  CPC ....... B60W 2720/14; B60W 2050/143; B60W 2050/146; B60W 2510/18; B60W 2520/105; B60W 2520/14; B60W 2710/1005; B60W 2050/021; B60W 2510/1005; B60W 2520/10; B60W 2550/142; G01R 31/3275; G01R 31/3277; G01R 31/007; B60Y 2300/181; B60Y 2300/18116; F16H 2061/1208; F16H 2061/1216
  USPC ........................................................ 701/34.4
  See application file for complete search history.

(56) References Cited

U.S. PATENT DOCUMENTS

2009/0267714 A1* 10/2009 Arioka ..................... H01H 9/54
                                                        335/68
2012/0105065 A1*  5/2012 Namou .............. G01R 31/3275
                                                        324/415

FOREIGN PATENT DOCUMENTS

CN         102508154 A      6/2012
CN         102837614 A     12/2012

* cited by examiner

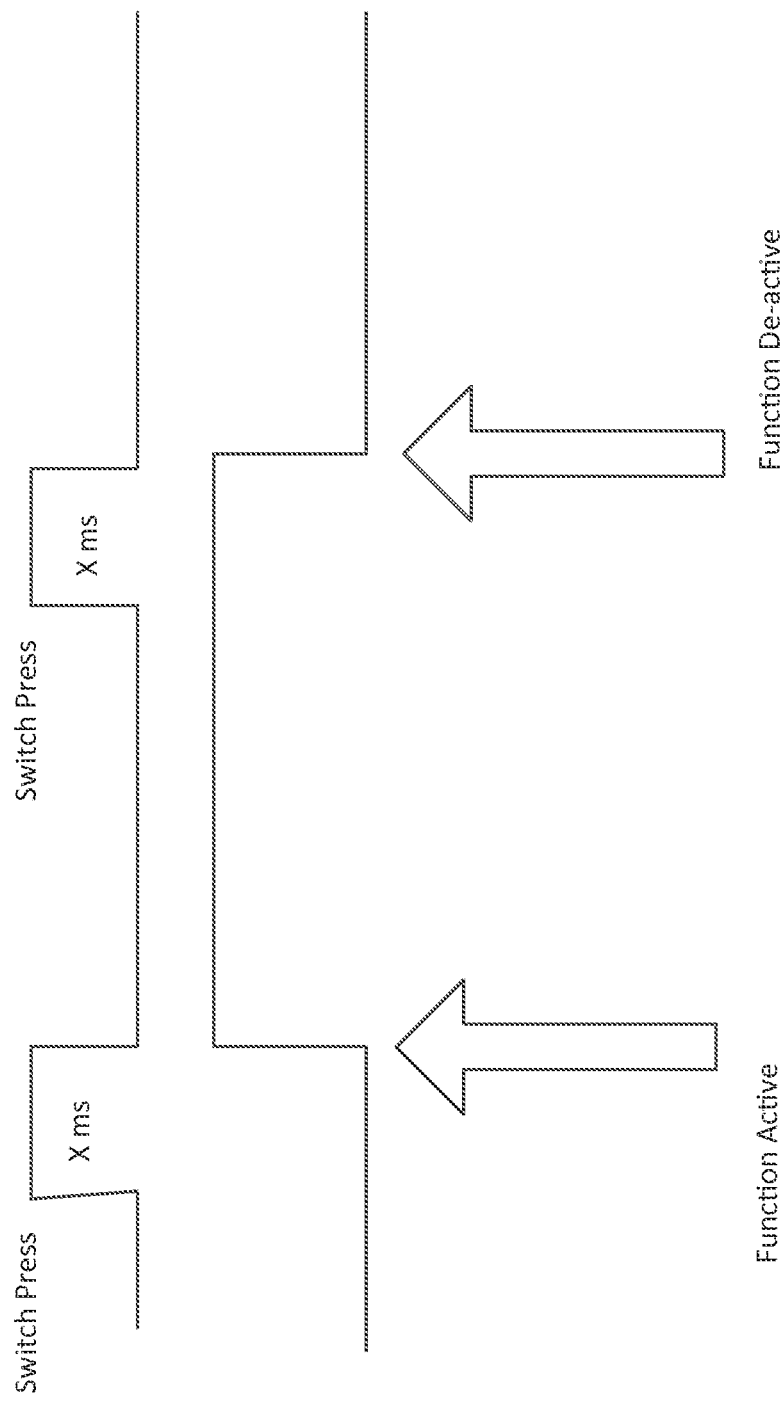

DYNAMIC STUCK SWITCH MONITORING

FIELD

Embodiments of the present invention relate to systems and methods for detecting a stuck switch and recovering from the same.

SUMMARY

When a driver-activated switch or other input mechanism gets stuck on a vehicle, it can be important that the situation is detected. These situations can be detected by sensing conditions of the switch and comparing the sensed conditions to fixed values. As vehicle conditions change, however, the fixed values may not accurately or efficiently detect stuck switch situations.

Accordingly, embodiments of the present invention provide systems and methods for monitoring a switch in a vehicle, such as in a hill descent control ("HDC") switch or a select speed control ("SSC") switch, to detect when the switch is stuck based on current vehicle driving conditions. In one embodiment, the systems and methods detect a stuck switch when a signal from the switch is high for a period of time. The period of time is dynamically changed based on current vehicle conditions (e.g., vehicle speed, gear selection, yaw rate, acceleration, etc.). When a stuck switch condition is detected, the systems and methods can notify the driver visually, audibly, and/or with tactile feedback. The systems and methods can also determine whether a switch has recovered from a stuck state based on whether a signal associated with the switch is low for a period of time. Similar to the period of time used to detect a stuck switch state, the period of time for detecting recovery from a stuck switch state can be dynamically generated. Accordingly, embodiments of the invention provide dynamic detection of stuck switch states and associated recovery based on current vehicle conditions rather than fixed values. Using current vehicle conditions provides more robustness, maturity, and visibility to the driver and vehicle functionalities.

For example, in one embodiment, the invention provides a system for monitoring a switch included in a vehicle. The system includes a controller configured to obtain at least one current driving condition and dynamically generate at least one parameter for detecting a predetermined state of the switch based on the at least one current driving condition. The controller is also configured to receive a signal from the switch, compare the signal to the at least one parameter, and determine a state of the switch when the signal satisfies the at least one parameter.

Another embodiment of the invention provides a method of monitoring a switch included in a vehicle. The method includes obtaining a current vehicle speed, and dynamically, by a controller, generating a duration for detecting a stuck state of the switch based on at least the current vehicle speed, detecting, by the controller, a duration of a high signal received from the switch. The method also includes comparing, by the controller, the duration of the high signal to the generated duration, and detecting, by the controller a stuck state of the switch when the duration of the high signal satisfies the generated duration.

Other aspects of the invention will become apparent by consideration of the detailed description and accompanying drawings.

BRIEF DESCRIPTION OF THE DRAWINGS

FIG. 3A illustrates signals provided by a switch to activate and deactivate particular vehicle functionality associated with the switch.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

It should also be noted that a plurality of hardware and software based devices, as well as a plurality of different structural components may be used to implement the invention. In addition, it should be understood that embodiments of the invention may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the invention may be implemented in software (e.g., stored on non-transitory computer-readable medium) executable by one or more processing units. As such, it should be noted that a plurality of hardware and software based devices, as well as a plurality of different structural components may be utilized to implement the invention. For example, "control units" and "controllers" described in the specification can include one or more processing units, one or more memory modules including non-transitory computer-readable medium, one or more input/output interfaces, and various connections (e.g., a system bus) connecting the components.

Figure 1:
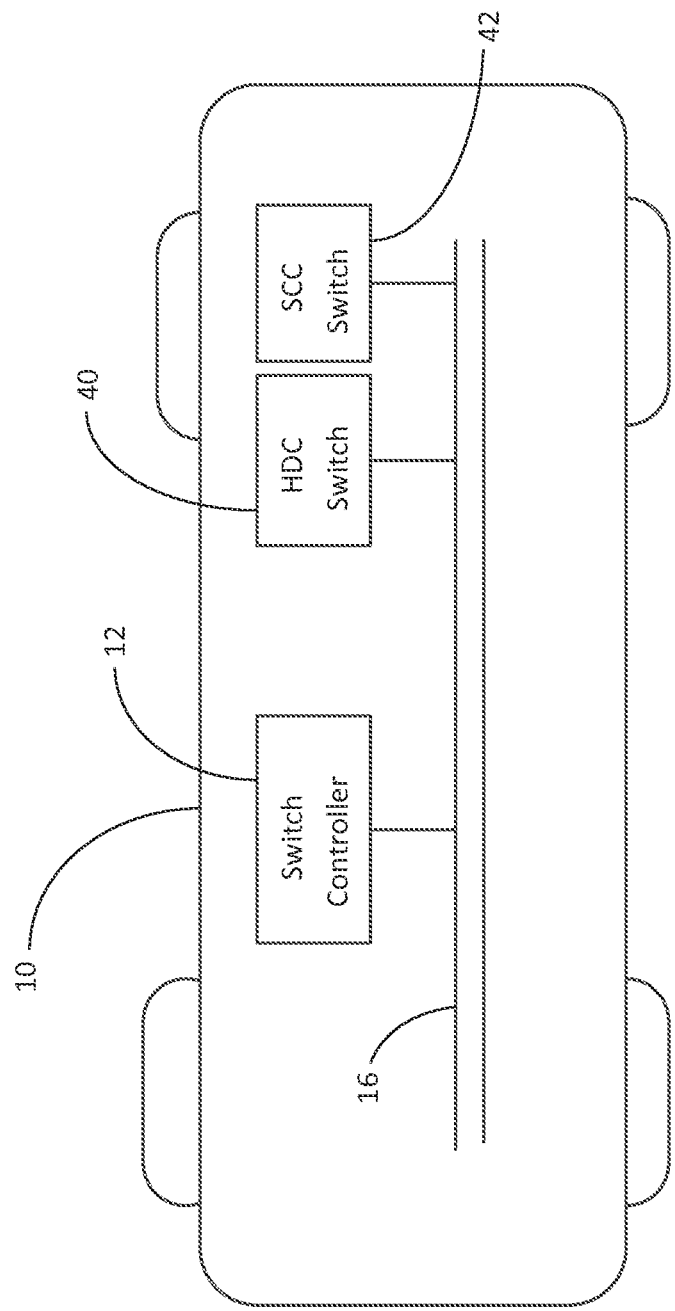
FIG. 1 schematically illustrates a vehicle including a switch controller and at least one switch.

FIG. 1 illustrates a vehicle 10. The vehicle 10 includes a switch controller 12. The switch controller 12 can be connected to a network included in the vehicle 10, such as a controller area network ("CAN") bus 16, that allows the controller 12 to exchange data with other components included in the vehicle 10.

Figure 2:
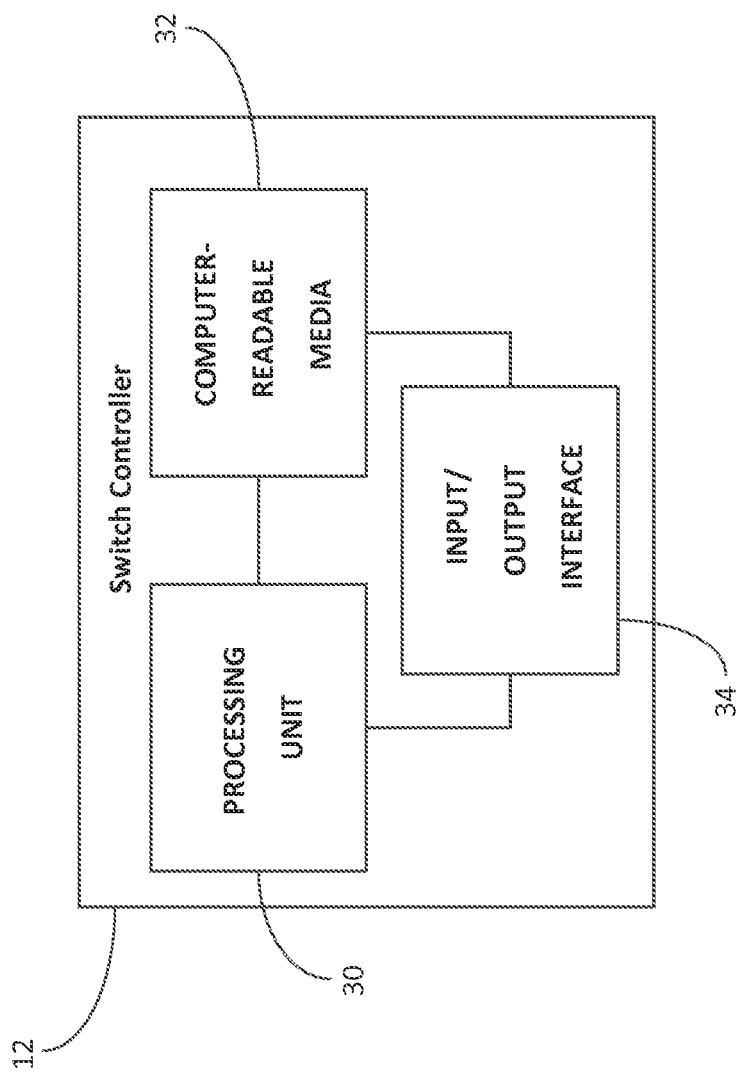
FIG. 2 schematically illustrates the switch controller of FIG. 1.

As illustrated in FIG. 2, the switch controller 12 includes a processing unit 30 (e.g., a microprocessor, application specific integrated circuit, etc.), non-transitory computer-readable media 32, and an input/output interface 34. The computer-readable media 32 can include random access memory ("RAM") and/or read-only memory ("ROM"). The input/output interface 34 transmits and receives information from devices external to the controller 12 (e.g., over the bus 16 and/or over direct (e.g., wired) connections). The processing unit 30 receives information (e.g., from the media 32 and/or the input/output interface 34) and processes the information by executing one or more instructions or modules. The instructions of modules are stored in the computer-readable media 32. The processing unit 30 also stores information (e.g., information received from the bus 16 or information generated by instructions or modules executed by the processing unit 30) to the media 32. It should be understood that although only a single processing unit, input/output interface, and computer-readable media module are illustrated in FIG. 2, the switch controller 12 can include multiple processing units, memory modules, and/or input/output interfaces.

The instructions stored in the computer-readable media 32 provide particular functionality when executed by the processing unit 30. In general, the instructions, when executed by the processing 30, perform adaptive (i.e., vehicle condition based) switch monitoring as described in more detail below.

The vehicle 10 also includes one or more driver-actuated switches. For example, as illustrated in FIG. 1, the vehicle 10 includes a hill descent control ("HDC") switch 40 and a select speed control ("SCC") switch 42. A driver of the vehicle 10 can activate and deactivate HDC functionality by pressing the switch 40. HDC functionality controls downhill speeds of the vehicle 10. Similarly, a driver of the vehicle 10 can activate and deactivate SCC functionality by pressing the switch 42. SCC functionality controls vehicle speed during off-road driving to provide driver comfort and safety. In some embodiments, both switches 40 and 42 are located on an interior instrument panel of the vehicle 10.

Signals generated based on positions of the switches 40 and 42 (e.g., based on whether the switch is pressed or not pressed) can be used by the switch controller 12 to determine whether HDC functionality and/or SCC functionality should be activated or deactivated. In some embodiments, the switch controller 12 is combined with a brake system module ("BSM") controller and/or an electronic stability program ("ESP") controller. Accordingly, the switch controller 12 can be configured to monitor a switch status as described below and can also be configured to control vehicle brakes based on signals from a switch, normally performed by a BSM controller, and/or can be configured to control vehicle stability based on signals from a switch, normally performed by an ESP controller. In other embodiments, the switch controller 12 performs switch state monitoring and communicates with a separate BSM controller and/or ESP controller as necessary.

In some embodiments, one or both of the switches 40 and 42 are directly connected (e.g., using physical wiring) to the switch controller 12. In other embodiments, one or both of the switches 40 and 42 are coupled to the switch controller 12 over the CAN bus 16 (see, e.g., FIG. 2). Also, in some embodiments, one or both switches 40 and 42 are coupled to a device included in the vehicle 10 (e.g., a BSM controller), which acts as a gateway between the switches 40 and 42 and the switch controller 12. The switches 40 and 42 can be coupled to the intermediate device using a direct connection and/or via a network connection, such as the CAN bus 16. Similarly, the intermediate controller can be coupled to the switch controller 12 using a direct connection or a network connection.

Each of the switches 40 and 42 can be a momentary push switch that a driver can push for a short duration to activate or deactivate HDC and/or SSC functionality (e.g., as compared to requiring that the driver continuously hold the switch in a particular position). Accordingly, a one-time driver push and release of one of the switches 40 and 42 provides toggle signal behavior (e.g., a high signal followed by a low signal). The toggle signal is used by the switch controller 12 (and/or a separate BSM and/or ESP controller) to determine whether HDC and/or SCC functionality should be activated or deactivated. For example, FIG. 3A illustrates a typical toggle signal received from one of the switches 40 and 42. As illustrated in FIG. 3A, a one-time driver push can be used to activate vehicle functionality (if not already activated) or deactivate vehicle functionality (if already activated). For example, as illustrated in FIG. 3A, a driver can press a switch two times. The first press activates functionality and the second press deactivates the functionality. The switch press duration varies with driver push and signal filtering (e.g., by the CAN bus 16 and/or other transmitters). Typically, however, a switch toggle duration (i.e., a press and release) is in the range of milliseconds.

Figure 3B:
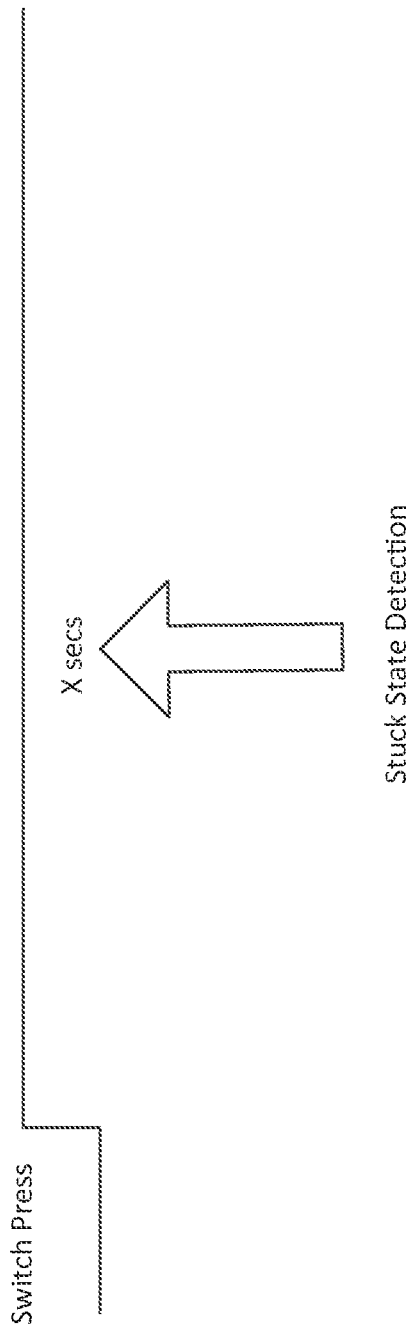
FIG. 3B illustrates signals provided by a switch in a stuck state.

It is possible that one of the switches 40 and 42 can get stuck in a push position (i.e., continuously provides a high signal rather than a high-followed-by-low toggle signal). For example, FIG. 3B illustrates a signal received from a switch when the switch is in a stuck state. This situation can occur when the driver presses the switch and does not release the switch, when the switch does not travel back to a non-pressed position after the driver presses the switch (i.e., a mechanical issue with the switch), and/or an object (e.g., a purse, ladder, etc.) presses and holds the switch unintentionally.

Figure 4:
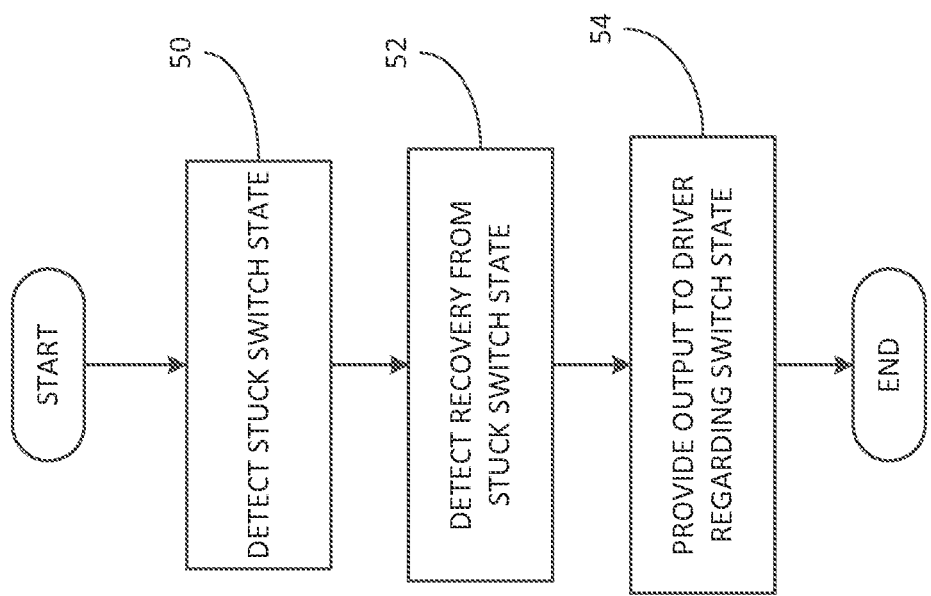
FIG. 4 is a flow chart illustrating a method of monitoring a switch performed by the switch controller of FIG. 1.

As noted above, the switch controller 12 is configured to monitor the state of a switch. This monitoring can include detecting stuck switch states and recoveries from stuck switch states. For example, the switch controller 12 can be configured to perform the method illustrated in FIG. 4. As illustrated in FIG. 4, the method includes detecting a stuck state of a switch (at block 50), detecting recovery from the stuck state (if it occurs) (at block 52), and providing output to the driver about the state of the switch (e.g., via a human machine interface ("HMI") or an electronic vehicle information center ("EVIC")) (at block 54).

As also noted above, in some existing vehicles, a controller is configured to detect a stuck switch if the controller receives a high signal from a switch for more than a predetermined, fixed amount of time. The fixed time value may not accurately or efficiently detect stuck switch situations under particular driving situations. Accordingly, in embodiments of the present invention, the switch controller 12 is configured to select a duration for detecting a stuck state or recovery from a stuck state in real-time based on current vehicle driving conditions. For example, in some embodiments, the duration may be set to a longer or shorter period depending on whether the current vehicle driving conditions suggest that the functionality associated with the switch is likely needed or usable.

In particular, to monitor a state of a switch, the switch controller 12 can be configured to dynamically generate at least one parameter for detecting a state of a switch (e.g., a stuck state or a recovery from stuck state) based on real-time, current driving conditions. In some embodiments, the at least one parameter includes a duration to be compared with a detected duration of a continuous high signal or a continuous low signal from a switch. If the detected duration satisfies (e.g., equals or exceeds) the generated duration, the switch controller 12 detects a particular state of the switch. In some embodiments, as described in more detail below, the generated duration can include a high, low, and default duration for detecting a stuck state and a high, low, and default duration for detecting a recovery from a stuck state.

Hill Descent Control (HDC)

Figure 5A:
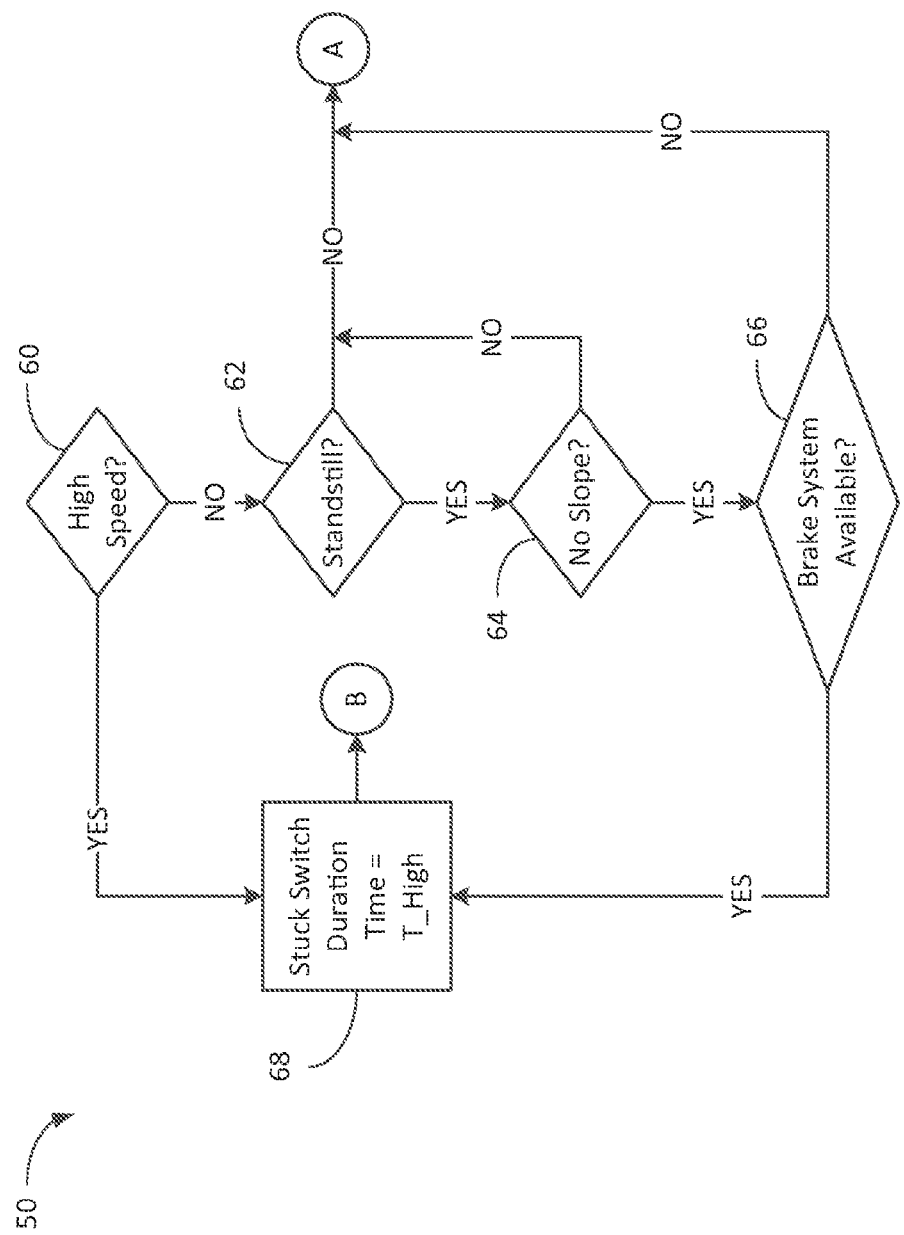
FIGS. 5A-C is a flow chart illustrating a method performed by the switch controller of FIG. 1 to detect a stuck hill descent control switch.
Figure 5B:
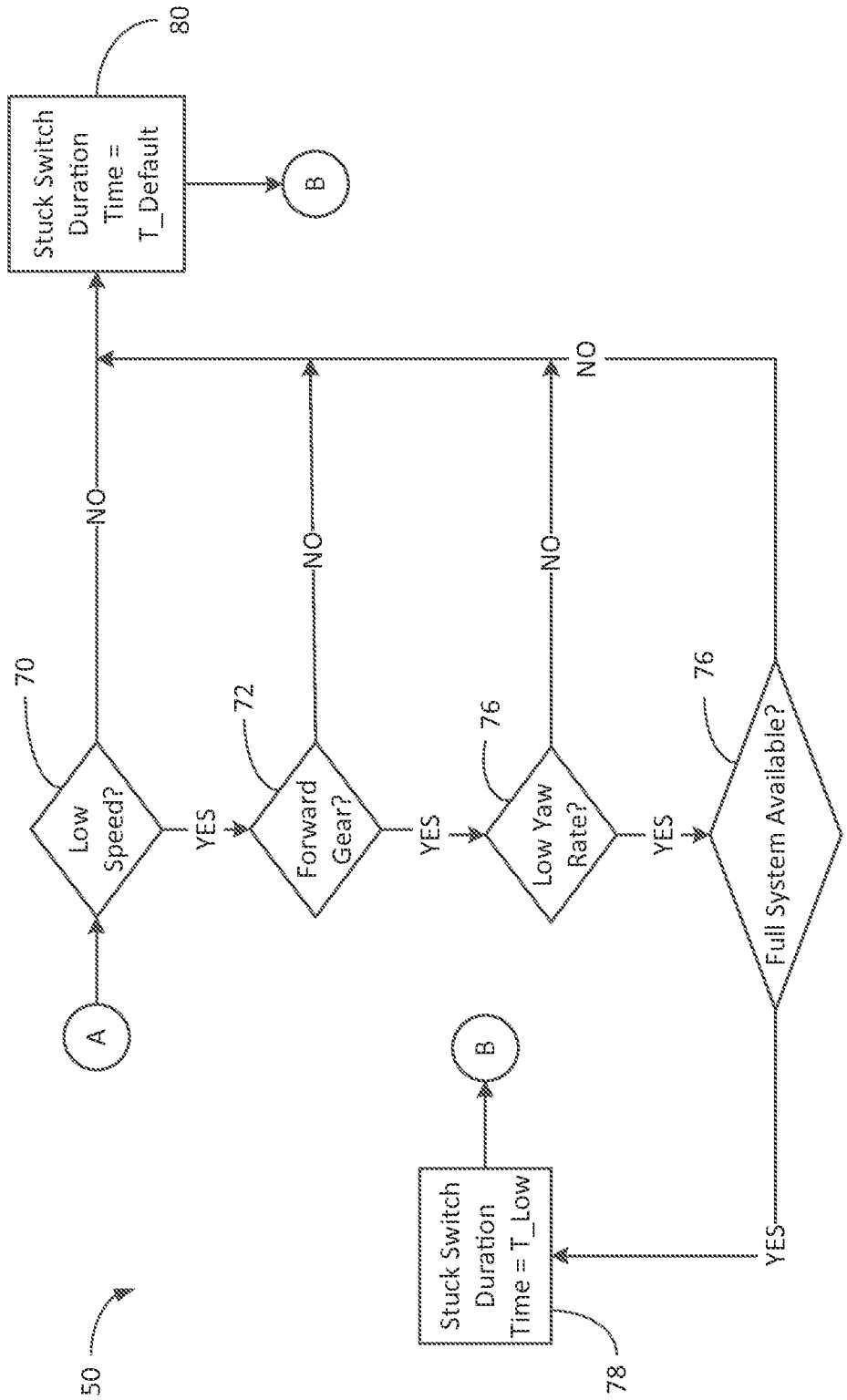
Figure 5C:
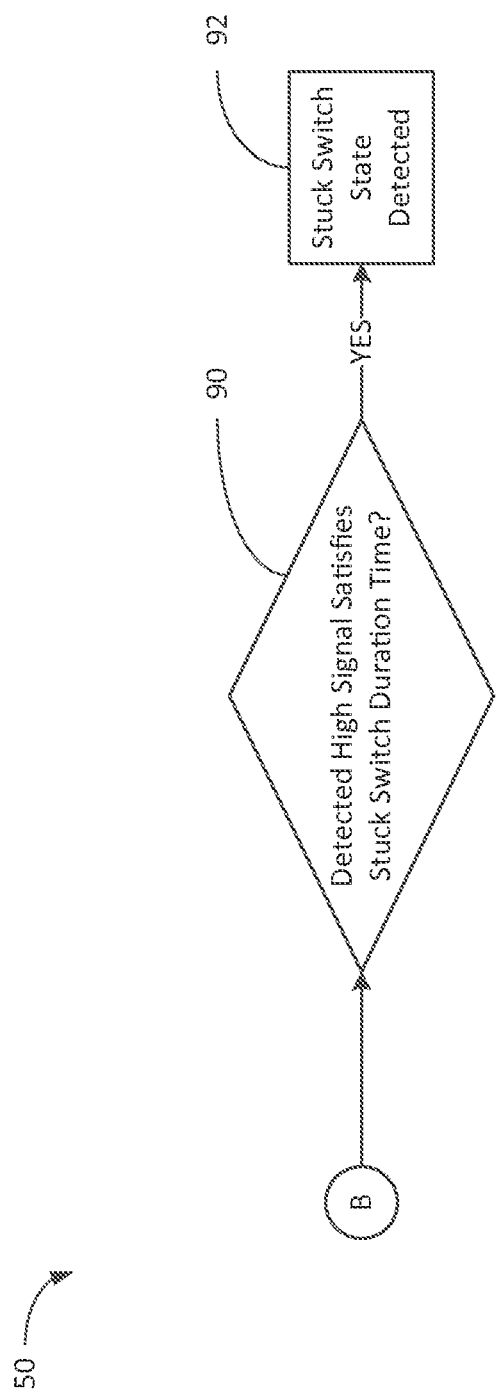

FIGS. 5A-C illustrate detect on of a stuck state of the HDC switch 40 performed by the switch controller 12 (at block 50 of FIG. 4). As illustrated in FIG. 5A, under certain driving conditions, HDC functionality may not have a high probability of being used and/or needed. These conditions can include, but are not limited to:

(1) high vehicle speed (e.g., greater than approximately 5 miles per hour) OR (2) (i) vehicle standstill (e.g., vehicle is in park or neutral and not in 4-wheel low) AND (ii) vehicle is not on a slope AND (iii) a brake control system is available.

Accordingly, the switch controller 12 can be configured to obtain a current vehicle speed and compare the current vehicle speed to a predetermined value (e.g., threshold or range) (at block 60). Alternatively or in addition, the switch controller 12 can be configured to obtain a current vehicle gear selection (e.g., park, neutral, drive, 4-wheel low, 4-wheel high, etc.) (at block 62), determine whether the vehicle is not on a slope (at block 64), and determine brake control system availability (at block 66). To determine whether the vehicle is not on a slope, the switch controller 12 can obtain a current longitudinal acceleration value (ax) and determine if the longitudinal acceleration is less than a predetermined value (e.g., approximately 0.05 g or 0.5 meters per second per second) and obtain a current vertical acceleration value (az) and determine if the vertical acceleration is within a predetermined range (between approximately 0.95 g and approximately 1.05 g). Also, to determine whether a brake control system is available, the switch controller 12 can determine whether a brake control system (e.g., an ESP system) is not currently operating in a degraded state due to an error in the system or driver input. If the obtained current vehicle conditions satisfy either of the conditions (1) and (2) set forth above, the switch controller 12 sets the duration used to detect a stuck switch state to a high value (e.g., T_High) (e.g., approximately 30 seconds) (at block 68).

Under other driving conditions, as illustrated in FIG. 5B, HDC functionality may have a greater probability of being used or needed. These conditions can include, but are not limited to:

(1) (i) low vehicle speed (e.g., less than approximately 5 miles per hour) AND (ii) the vehicle is in a 4-wheel low (forward) gear AND (iii) low vehicle yaw rate (e.g., less than approximately 2 degrees per second) AND (iv) a brake control system is available.

Accordingly, the switch controller 12 can be configured to obtain a current vehicle speed and compare the current vehicle speed to a predetermined value (e.g., threshold or range) (at block 70), obtain a current vehicle gear selection (e.g., park, neutral, drive, 4-wheel low, 4-wheel high, etc.) (at block 72), obtain a current vehicle yaw rate and compare the yaw rate to a predetermined value (e.g., threshold or range) (at block 74), and obtain information regarding brake control system availability (at block 76). As noted above, to determine whether a brake control system is available, the switch controller 12 can determine whether a brake control system (e.g., an ESP system) is not currently operating in a degraded state. If the obtained current vehicle conditions satisfy the condition (1) set forth above, the switch controller 12 sets the duration used to detect a stuck switch state to a low value (e.g., T_Low) (e.g., approximately 10 seconds) (at block 78).

As illustrated in FIG. 5B, in some embodiments, the duration used to detect a stuck switch state can be set to a default value (e.g., approximately 14 seconds) (at block 80) if the duration is not set to the high value or the low value as described above.

As illustrated in FIG. 5C, after setting the duration used to detect a stuck switch state, the switch controller 12 obtains the current duration of a high signal from the HDC switch 40 and compares the current duration to the set duration (at block 90). If the current duration satisfies (e.g., equals or exceeds) the set duration, the switch controller 12 detects that the HDC switch 40 is stuck (at block 92).

In some embodiments, the switch controller 12 can also be configured to not detect stuck states of the HDC switch 40 during certain vehicle conditions. These conditions can include when functionality associated with the switch 40 has failed, when functionality associated with the switch 40 is already active, or when ESP control is active or When the vehicle is in a diagnostic mode.

As illustrated in FIG. 4, after the switch controller 12 detects a stuck HDC switch 40 (at block 50), the switch controller 12 can be configured to check the switch's functional validity before using it for function activation and deactivation (at block 52). In some embodiments, the HDC switch 40 can be trusted again if the switch controller 12 receives a continuously low signal from the switch 40 for a period of time. In particular, receiving a continuous low signal from the switch 40 provides assurance that the stuck state no longer exists.

As described above for detecting a stuck HDC switch 40, the switch controller 12 can be configured to dynamically calculate the period of time for detecting, recovery of a stuck HDC switch 40. For example, the switch controller 12 can be configured to select different recovery durations in real-time based on current vehicle driving conditions.

Figure 6A:
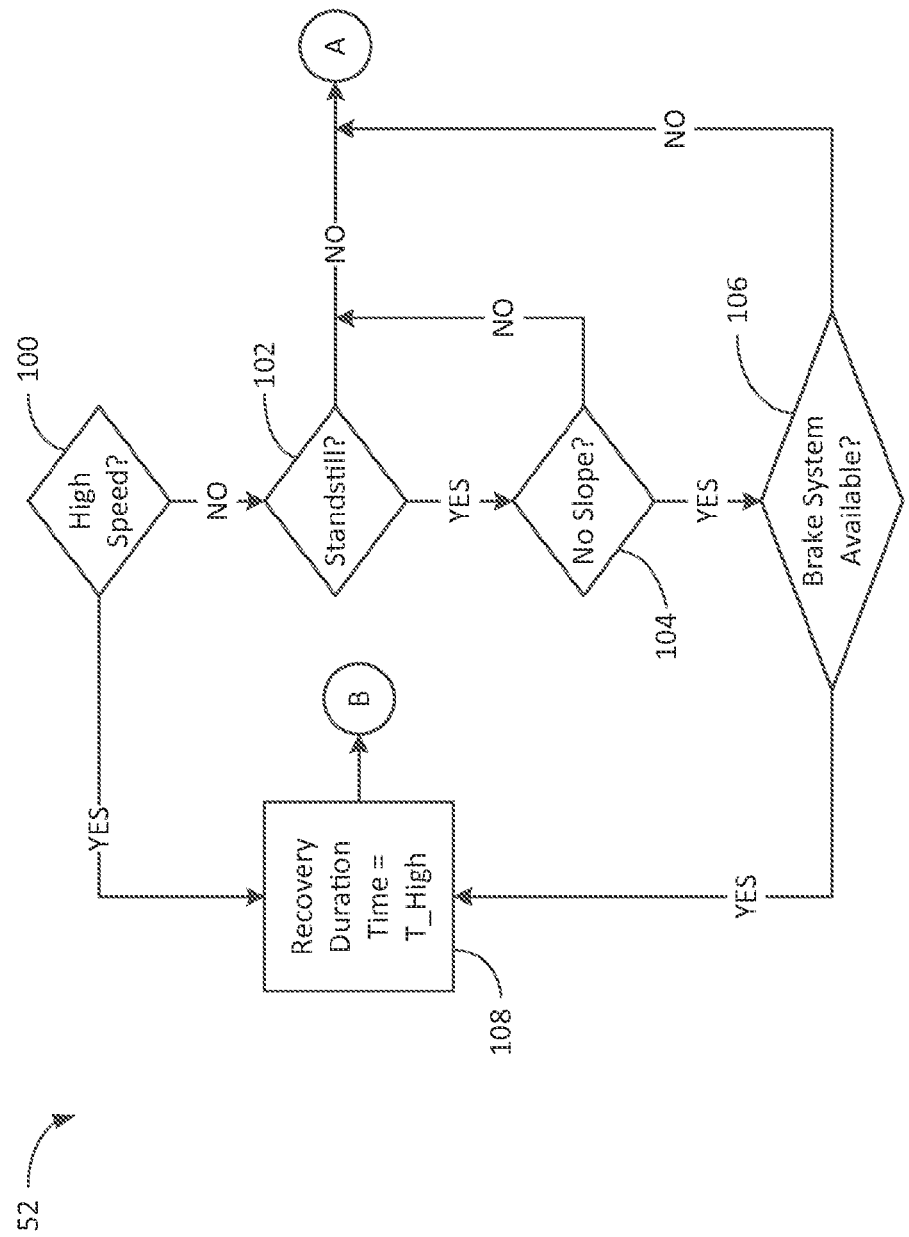
FIGS. 6A-C is a flow chart illustrating a method performed by the switch controller of FIG. 1 to detect recovery of a stuck hill descent control switch.
Figure 6B:
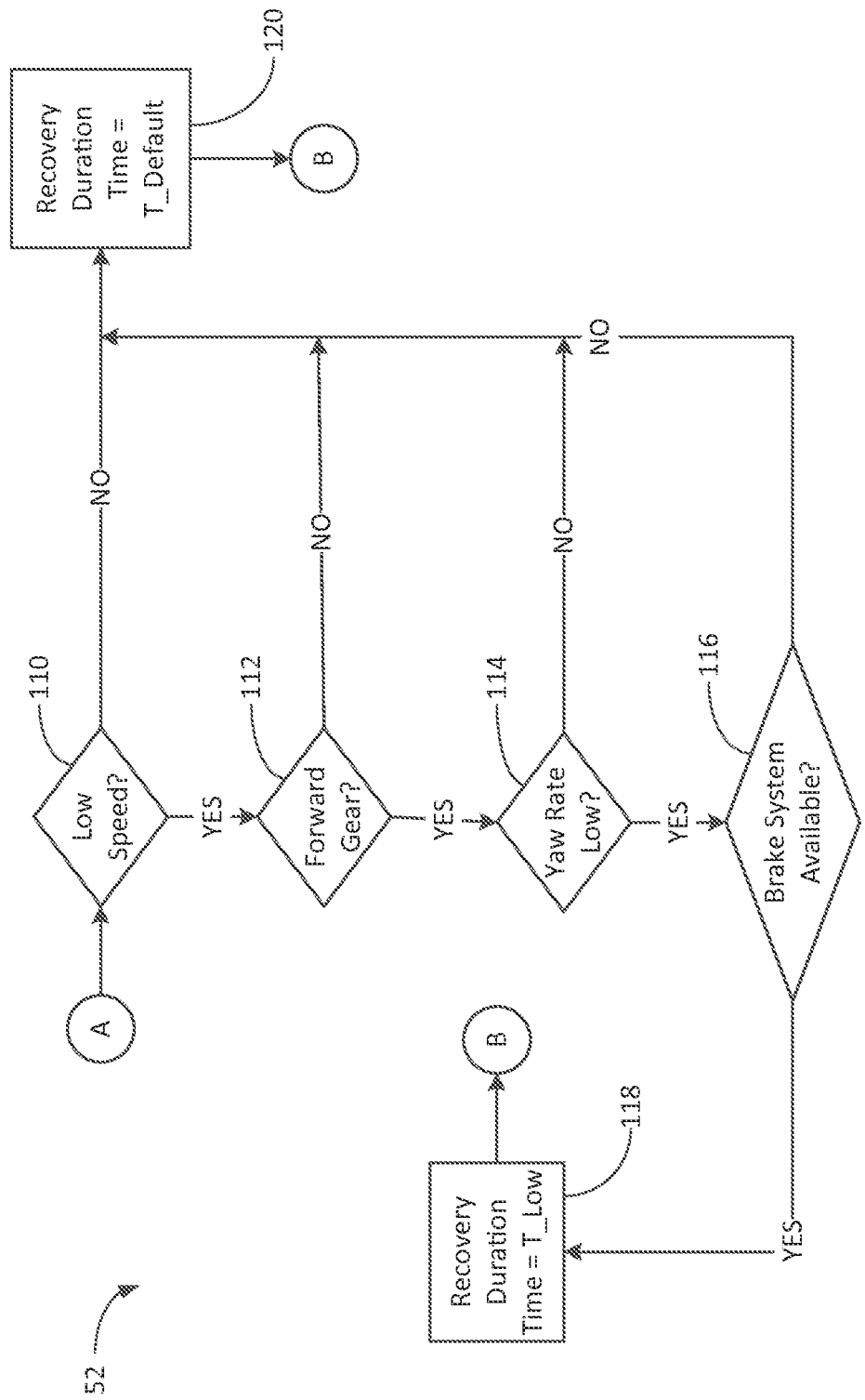
Figure 6C:
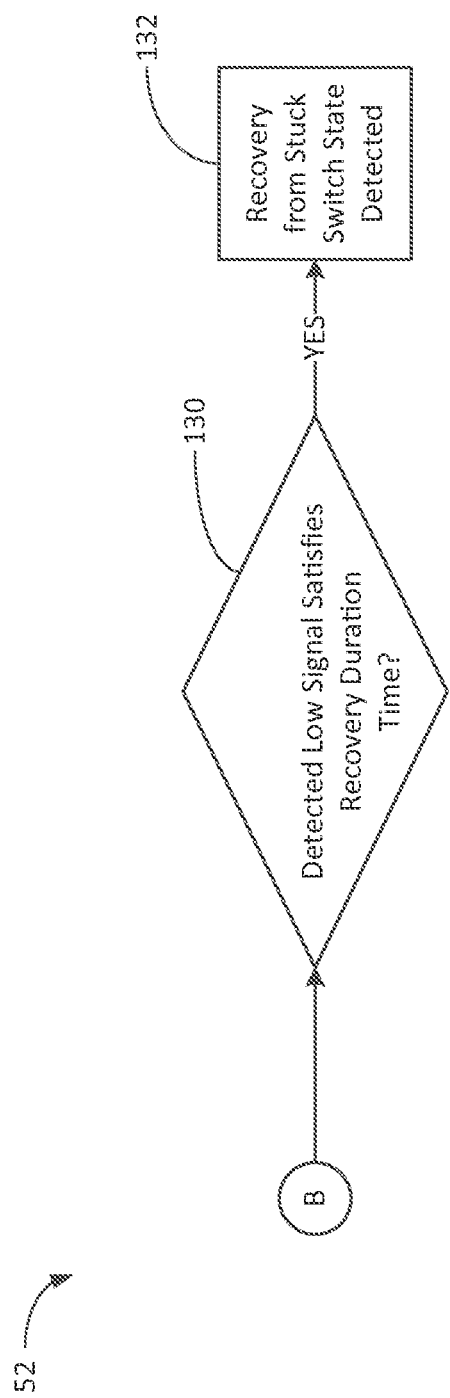

For example, FIGS. 6A-C illustrate detection of recovery from a stuck state of the HDC switch 40 performed by the switch controller 12 (at block 52 of FIG. 4). As illustrated in FIG. 6A, under certain driving conditions, HDC functionality may not have a high probability of being used and/or needed (and, therefore, it makes sense to require a longer continuous low signal before trusting the switch 40 again). These conditions can include, but are not limited to:

(1) high vehicle speed (e.g., greater than approximately 5 miles per hour) OR (2) (i) vehicle standstill (e.g., vehicle is in park or neutral and not in 4-wheel low) AND (ii) vehicle not on a slope AND (iii) a brake control system is available.

Accordingly, the switch controller 12 can be configured to obtain a current vehicle speed and compare the current vehicle speed to a predetermined value (e.g., threshold or range) (at block 100). Alternatively or in addition, the switch controller 12 can be configured to obtain a current vehicle gear selection (e.g., park, neutral, drive, 4-wheel low, 4-wheel high, etc.) (at block 102), determine whether the vehicle is not on a slope (at block 104), and determine whether brake control system availability (at block 106). As noted above, to determine whether the vehicle is not on a slope, the switch controller 12 can obtain a current longitudinal acceleration value (ax) and determine if the longitudinal acceleration is less than a predetermined value (e.g., approximately 0.05 g or 0.5 meters per second per second) and obtain a current vertical acceleration value (az) and determine if the vertical acceleration is within a predetermined range (between approximately 0.95 g and approximately 1.05 g). As also noted above, to determine whether a brake control system is available, the switch controller 12 can determine whether a brake control system (e.g., an ESP system) is not currently operating in a degraded state. If the obtained current vehicle conditions satisfy either of the conditions (1) and (2) set forth above, the switch controller 12 sets the duration used to detect recovery from a stuck switch state to a high value (e.g., T_High) approximately 30 seconds) (at block 108).

Under other driving conditions, as illustrated in FIG. 6B, HDC functionality may have a greater probability of being used or needed (and, therefore, it makes sense to require a shorter continuous low signal before trusting the switch 40 again to provide the driver with access to the functionality). These conditions can include, but are not limited to:
- (1) (i) low vehicle speed (e.g., less than approximately 5 miles per hour) AND
  - (ii) the vehicle is in 4-wheel low (forward) gear AND
  - (iii) low yaw rate (e.g., less than approximately 2 degrees per second) AND
  - (iv) a brake control system is available.

Accordingly, the switch controller 12 can be configured to obtain a current vehicle speed and compare the current vehicle speed to a predetermined value (e.g., threshold or range) (at block 110), obtain a current vehicle gear selection (e.g., park, neutral, drive, etc.) (at block 112), obtain a current vehicle yaw rate and compare the yaw rate to a predetermined value (e.g., threshold or range) (at block 114), and obtain information regarding brake system availability (at block 116). As also noted above, to determine whether a brake control system is available, the switch controller 12 can determine whether a brake control system (e.g., an ESP system) is not currently operating in a degraded state. If the obtained current vehicle conditions satisfy the condition (1) set forth above, the switch controller 12 sets the duration used to detect recovery from a stuck switch state to a low value (e.g., T_Low) (e.g., approximately 10 seconds) (at block 118).

As illustrated in FIG. 6B, in some embodiments, the recovery duration can be set to a default value (e.g., approximately 14 seconds) (at block 120) if the duration is not set to the high or the low value as described above.

As illustrated in FIG. 6C, after setting the duration used to detect recovery from a stuck switch state, the switch controller 12 obtains the current duration of a low signal from the HDC switch 40 and compares the current duration to the set duration (at block 130). If the current duration satisfies (e.g., equals or exceeds) the set duration, the switch controller 12 detects that the HDC switch 40 is no longer stuck and has recovered (at block 132).

Select Speed Control (SSC)

Figure 7A:
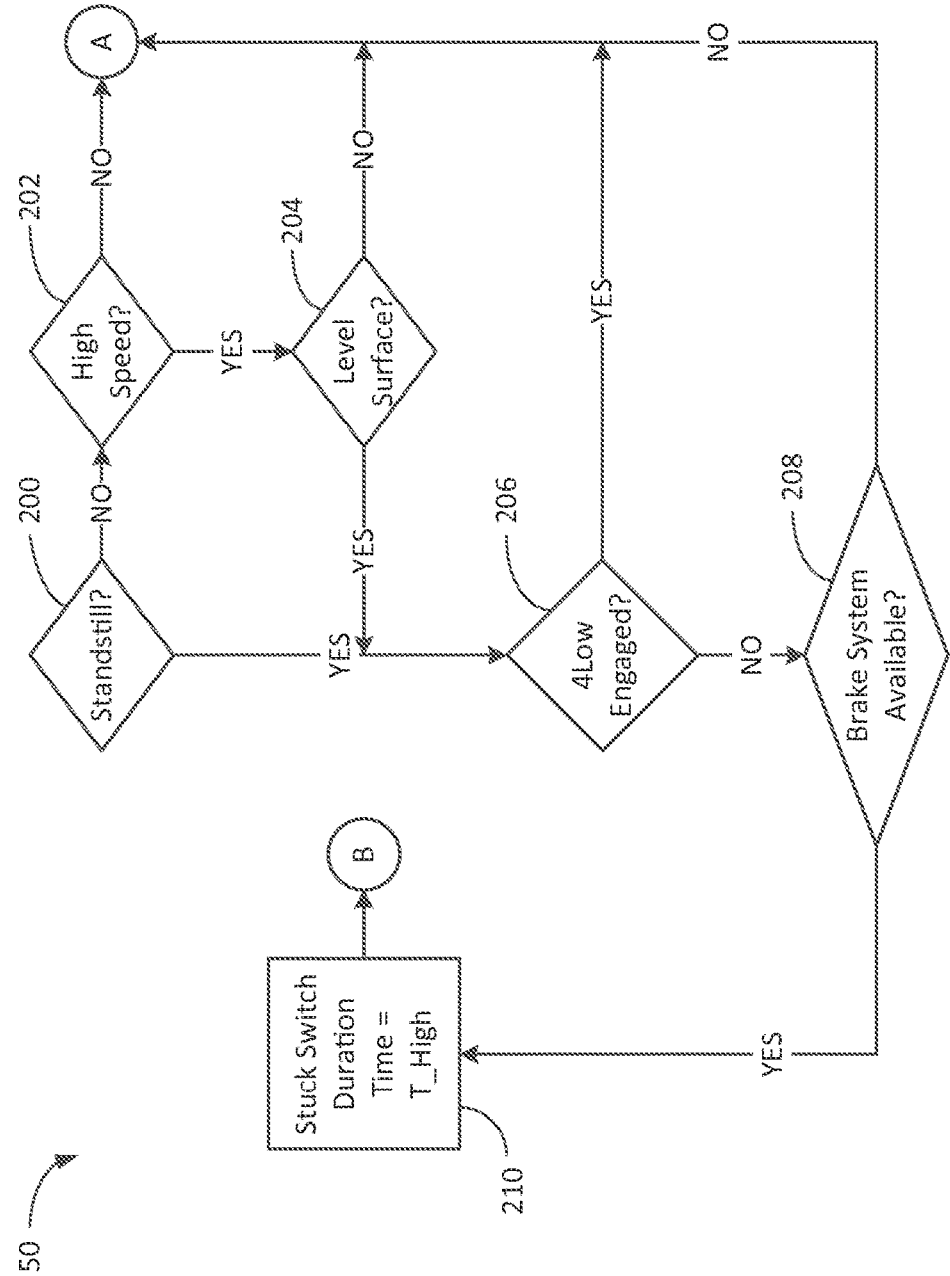
FIGS. 7A-C is a flow chart illustrating a method performed by the switch controller of FIG. 1 to detect a stuck speed select control switch.
Figure 7B:
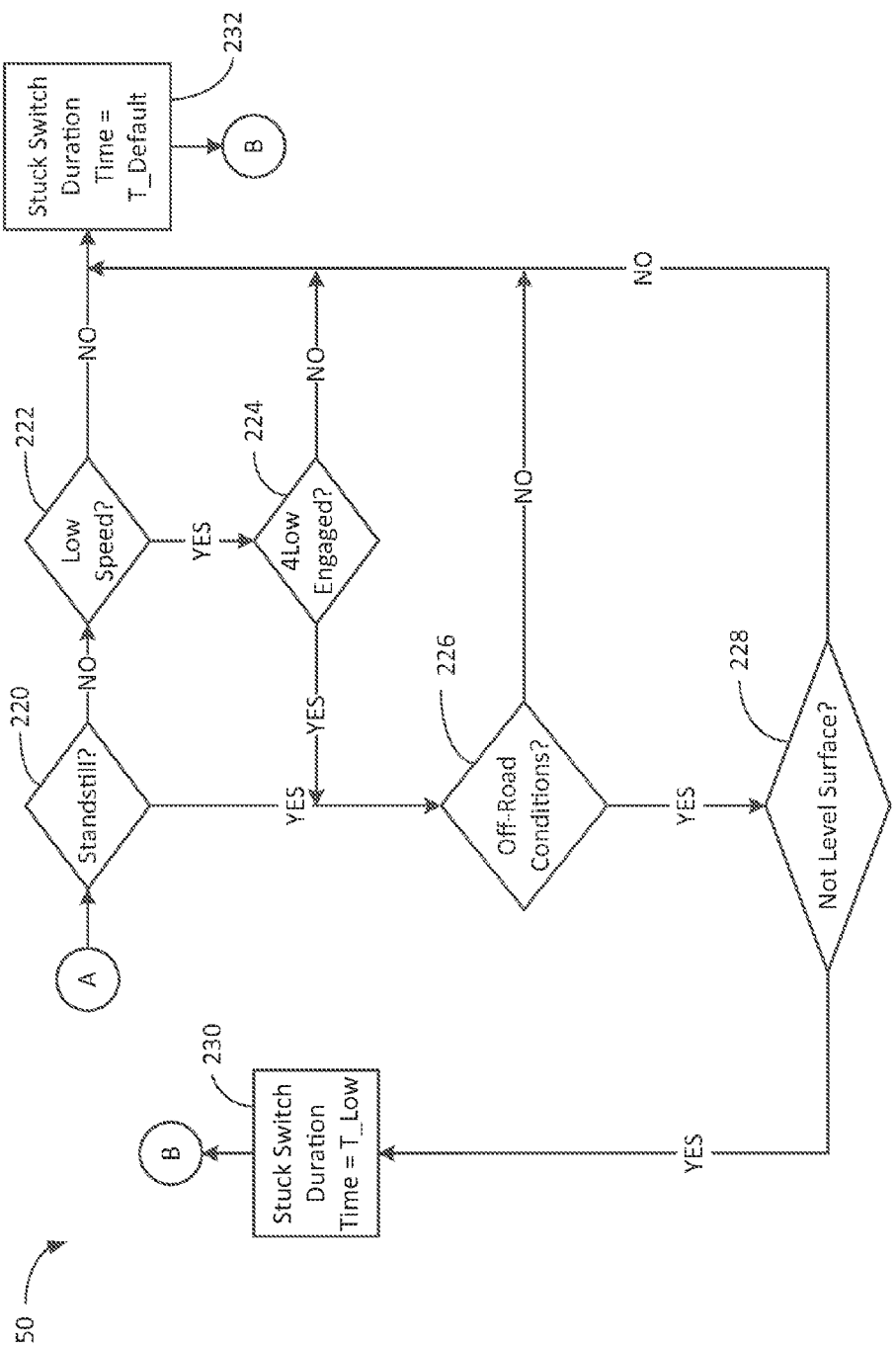
Figure 7C:
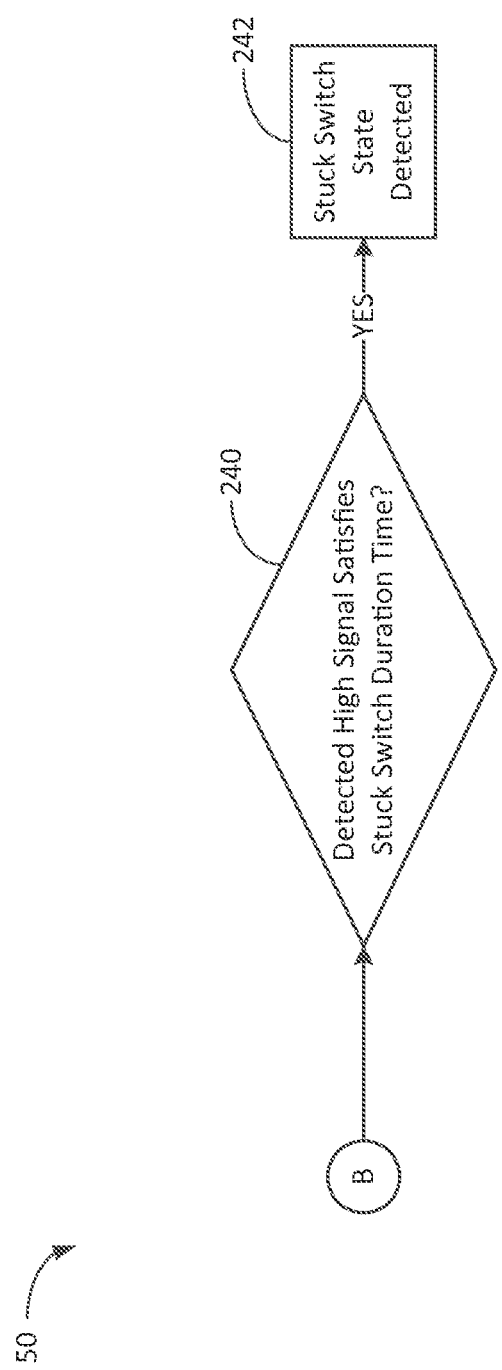

Similar functionality can also be applied by the switch controller 12 for the SSC switch 42. For example, FIGS. 7A-C illustrate detection of a stuck state of the SSC switch 42 performed by the switch controller 12 (at block 50 of FIG. 4). As illustrated in FIG. 7A, under certain driving conditions, SCC functionality may not have a high probability of being used and/or needed. These conditions can include, but are not limited to:
- (1) (i) vehicle standstill or high vehicle speed (e.g., greater than approximately 5 miles per hour) on a level surface (e.g., accelerations in the x, y, and/or z direction are near nominal values) AND
  - (ii) 4-wheel low gear is not engaged AND
  - (iii) a brake control system is available.

Accordingly, the switch controller 12 can be configured to obtain a current gear selection of the vehicle and determine if the vehicle is at a standstill (at block 200), obtain a current vehicle speed and compare the current vehicle speed to a predetermined value (e.g., threshold or range) (at block 202), obtain current vehicle acceleration(s) and compare the acceleration(s) to predetermined values (e.g., thresholds or ranges) associated with traveling on a level surface (at block 204), determine based on the current gear selection whether the 4-wheel low gear is engaged (at block 206), and obtain information regarding brake control system availability (at block 208). To determine whether the vehicle is traveling on a level surface, the switch controller 12 can be configured to compare a current longitudinal acceleration (ax) to a longitudinal acceleration from a wheel speed, determine if the current vertical acceleration (az) is approximately 9.8 m/s/s, and determine if the current acceleration in the y direction (ay) matches a model calculated from yaw rate and/or steering angle. For example, an ESP system often has model-based estimates of lateral acceleration (ay) (e.g., calculated based on other sensor reading and vehicle geometry). These models are valid on level surfaces but are not valid on bank curves or slopes. Therefore, if a current lateral acceleration of the vehicle 10 does not match the model-based estimates, the controller 12 can conclude that the vehicle 10 is not on a level surface. As also noted above, to determine whether a brake control system is available, the switch controller 12 can determine whether a brake control system (e.g., an ESP system) is not currently operating in a degraded state. If the obtained current vehicle conditions satisfy the condition (1) set forth above, the switch controller 12 sets the duration used to detect a stuck switch state to a high value (e.g., T_High) (e.g., approximately 30 seconds) (at block 210).

Under other driving conditions, as illustrated in FIG. 7B, SSC functionality may have a greater probability of being used or needed. These conditions can include, but are not limited to:
- (1) (i) vehicle standstill or low vehicle speed (e.g., less than approximately 5 miles per hour) in 4-wheel low gear AND
  - (ii) off-road driving conditions suspected AND
  - (iii) vehicle not on level surface.

Accordingly, the switch controller 12 can be configured to obtain a current vehicle gear selection and determine if the vehicle is at a standstill (at block 200), obtain current vehicle speed and compare the current vehicle speed to a predetermined value (e.g., threshold or range) (at block 222), determine based on the current gear selection whether the 4-wheel low gear is engaged (at block 224), obtain vehicle acceleration(s) and/or a yaw rate to determine whether off-road driving conditions exist (at block 226) and whether the vehicle is not on a level surface (at block 228). In some embodiments, to determine whether off-road driving conditions exist, the controller 12 can be configured to compare a vehicle yaw rate to a predetermined value. For example, if the yaw rate is less than approximately 2 degrees per second, the controller 12 can determine that off-road driving conditions exist. In other embodiments, the controller 12 can be configured to determine the rate of change of vehicle acceleration in at least one direction to determine if the rate of change is consistent with known off-road driving conditions. Similarly, to determine whether the vehicle is not on a level surface, the switch controller 12 can be configured to determine vehicle acceleration in at least one direction (e.g., the y direction) and determine if the acceleration is less than a predetermined value (e.g., threshold or range), such as approximately 1 meter per second per second. If the obtained current vehicle conditions satisfy the condition (1) set forth above, the switch controller 12 sets the duration used to detect a stuck switch state to a low value (e.g., T_Low) (e.g., approximately 10 seconds) (at block 230).

As illustrated in FIG. 7B, in some embodiments, the duration used to detect a stuck switch state can be set to a default value (e.g., approximately 14 seconds) (at block 232) if the duration is not set to the high or the low value as described above.

As illustrated in FIG. 7C, after setting the duration used to detect a stuck switch state, the switch controller 12 obtains the current duration of a high signal from the SSC switch 42 and compares the current duration to the set duration (at block 240). If the current duration satisfies (e.g., equals or exceeds) the set duration, the switch controller 12 detects that the SSC switch 42 is stuck (at block 242).

In some embodiments, the switch controller 12 can also be configured to not detect a stuck switch state of the SSC switch 42 during certain vehicle conditions. These conditions can include when functionality associated with the switch 42 has failed, when functionality associated with the switch 42 is already active, or when ESP control is active or when the vehicle is in a diagnostic mode.

As illustrated in FIG. 4, after the switch controller 12 detects a stuck SSC switch 42, the switch controller 12 can be configured to check the switch's functional validity before using it for function activation and deactivation (at block 52). In some embodiments, the SSC switch 42 can be trusted again if the switch controller 12 receives a continuously low signal from the switch 42 for a predetermined period of time. In particular, receiving a continuous low signal from a switch provides assurance that the stuck state no longer exists.

As described above for detecting a stuck SSC switch 42, the switch controller 12 can be configured to dynamically calculate the period of time for detecting recovery of a stuck SSC switch 42. For example, the switch controller 12 can be configured to select different recovery durations in real-time based on current vehicle driving conditions.

Figure 8A:
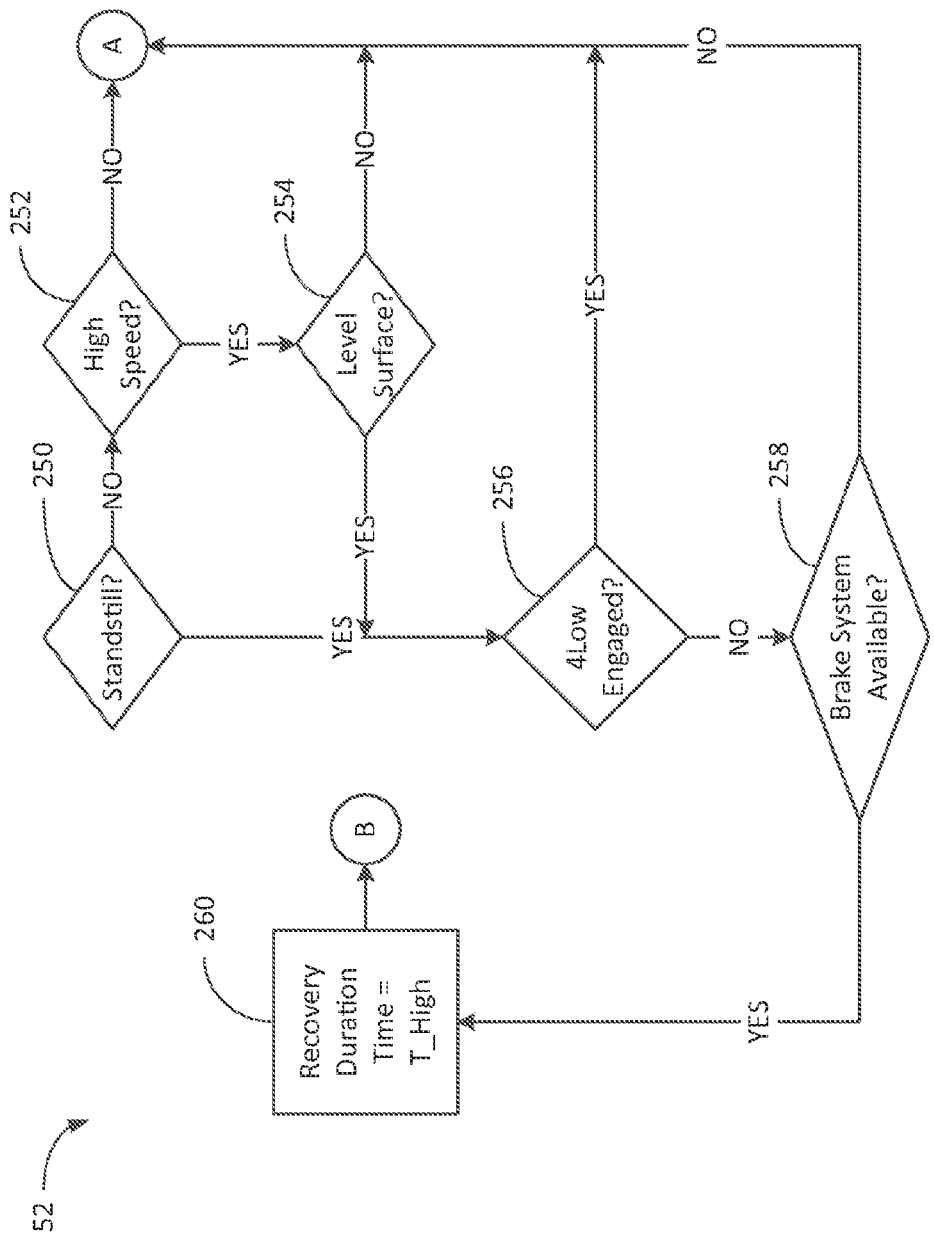
FIGS. 8A-C is a flow chart illustrating a method performed by the switch controller of FIG. 1 to detect recovery of a stuck speed select control switch.
Figure 8B:
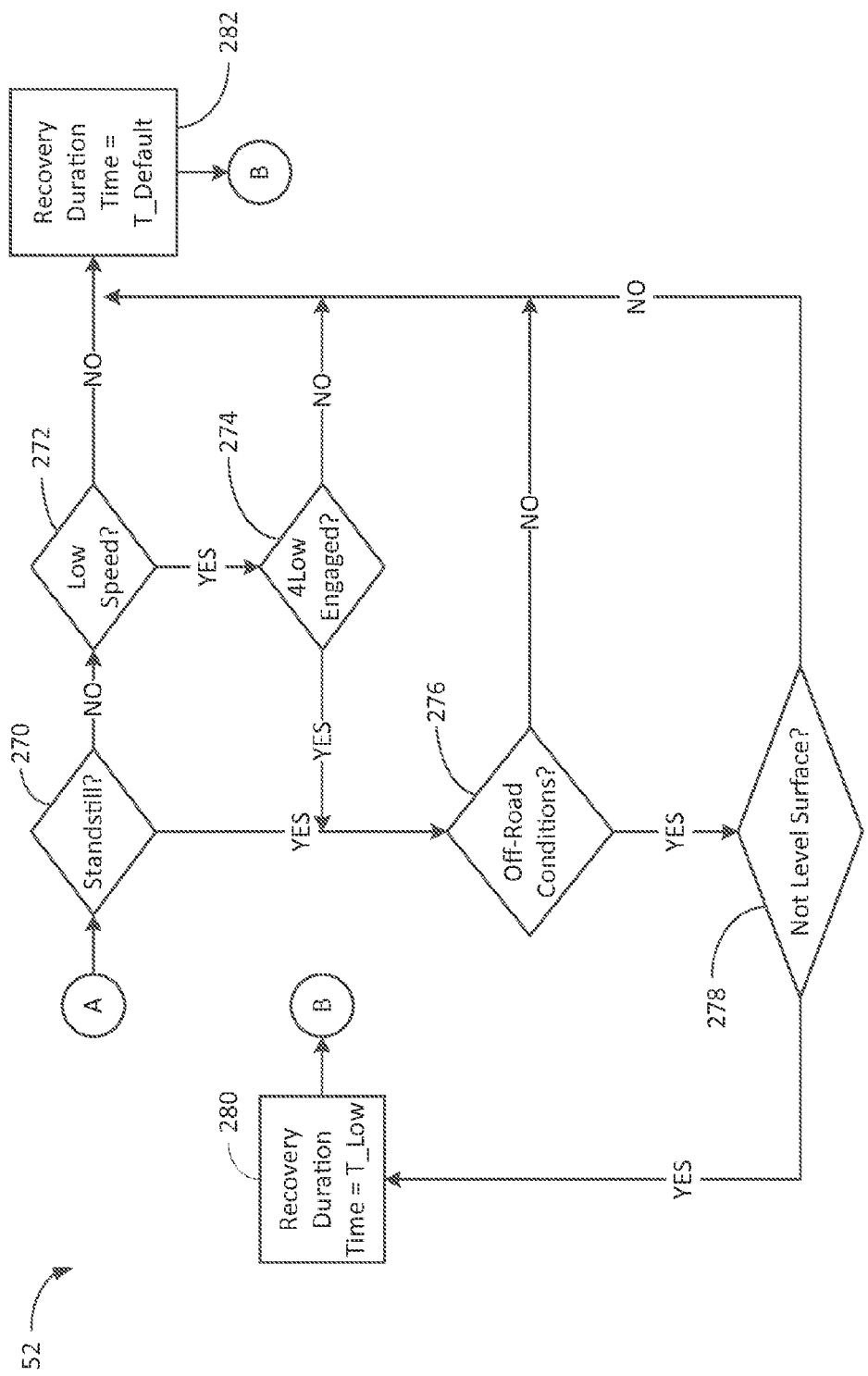
Figure 8C:
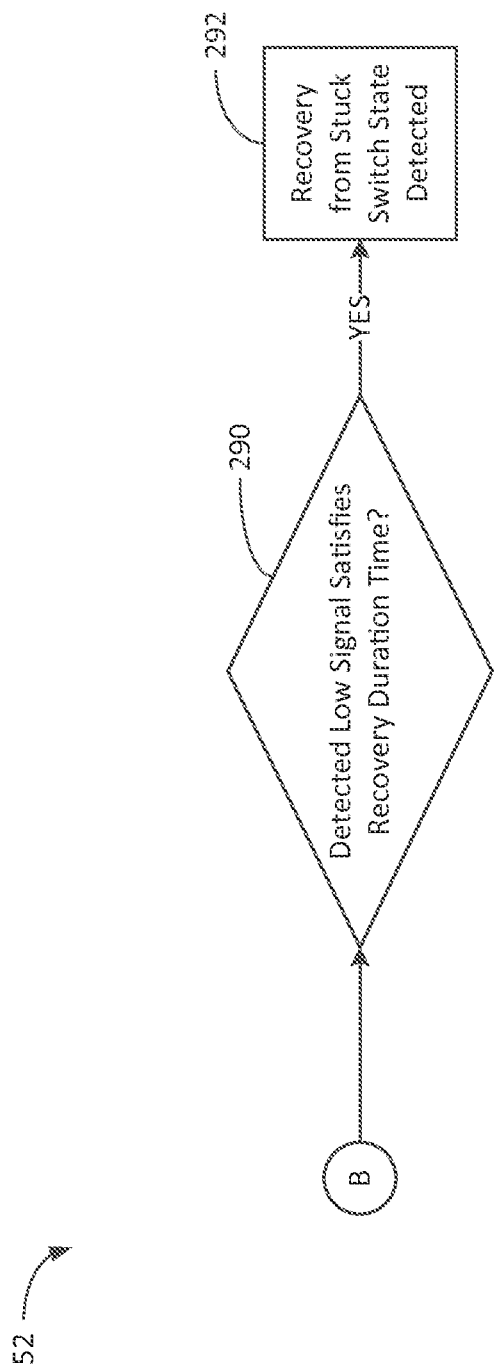

For example, FIGS. 8A-C illustrate detection of recovery from a stuck state of the SSC switch 42 performed by the switch controller 12 (at block 52 of FIG. 4). As illustrated in FIG. 8A, under certain driving conditions, SSC functionality may not have a high probability of being used and/or needed (and, therefore, it makes sense to require a longer continuous low signal before trusting the switch 40 again). These conditions can include, but are not limited to:
(1) (i) vehicle standstill or high vehicle speed (e.g., greater than approximately 5 miles per hour) on a level surface (e.g., accelerations in the x, y, and/or z direction are near nominal values) AND
(ii) 4-wheel low gear is not engaged AND
(iii) a brake control system is available.

Accordingly, the switch controller 12 can be configured to obtain a current gear selection and determine whether the vehicle is at a standstill (at block 250), obtain a current vehicle speed and compare the current vehicle speed to a predetermined value (e.g., threshold or range) (at block 252), obtain current vehicle acceleration(s) and compare the acceleration(s) to predetermined values (e.g., thresholds or ranges) associated with traveling on a level surface (at block 254), determine based on the current gear selection whether the 4-wheel low gear is engaged (at block 256), and obtain information regarding brake control system availability (at block 258). As described above, to determine whether the vehicle is traveling on a level surface, the switch controller 12 can be configured to compare a current longitudinal acceleration (ax) to a longitudinal acceleration from a wheel speed, determine if the current vertical acceleration (az) is approximately 9.8 m/s/s, and determine if the current acceleration in the y direction (ay) matches a model-estimated value (e.g., calculated from yaw rate and/or steering angle). As also described above, to determine whether a brake control system is available, the controller 12 can be configured to determine whether a brake control system (e.g., an ESP system) is not operating in a degraded state. If the obtained current vehicle conditions satisfy the condition (1) set forth above, the switch controller 12 sets the duration used to detect recovery from a stuck switch state to a high value (e.g., T_High) (e.g., approximately 30 seconds) (at block 260).

Under other driving conditions, as illustrated in FIG. 8B, SSC functionality may have a greater probability of being used or needed (and, therefore, it makes sense to require a shorter continuous low signal before trusting the switch 40 again to provide the driver with access the SCC functionality). These conditions can include, but are not limited to:
(1) (i) vehicle standstill or low vehicle speed (e.g., less than approximately 5 miles per hour) in 4-wheel low gear AND
(ii) off-road driving conditions suspected AND
(iii) vehicle not on level surface.

Accordingly, the switch controller 12 can be configured to obtain a current vehicle gear selection and determine if the vehicle is at a standstill (at block 270), obtain a current vehicle speed and compare the current vehicle speed to a predetermined value (e.g., threshold or range) (at block 272), determine based on the current vehicle gear selection whether the 4-wheel low gear is engaged (at block 274), obtain vehicle acceleration(s) and/or a yaw rate to determine whether off-road driving conditions exist (at block 276) and whether the vehicle is not on a level surface (at block 278). As noted above, in some embodiments, to determine whether off-road driving conditions exist, the controller 12 can be configured to compare a vehicle yaw rate to a predetermined value (e.g., threshold or range). For example, if the yaw rate is less than approximately 2 degrees per second, the controller 12 can determine that off-road driving conditions exist. In other embodiments, the controller 12 can be configured to determine the rate of change of vehicle acceleration in at least one direction to determine if the rate of change is consistent with known off-road driving conditions. Similarly, as also noted above, to determine whether the vehicle is not on a level surface, the switch controller 12 can be configured to determine vehicle acceleration in at least one direction (e.g., the y direction) and determine if the acceleration is less than a predetermined value, such as approximately 1 meter per second per second. If the obtained current vehicle conditions satisfy the condition (1) set forth above, the switch controller 12 sets the duration used to detect recovery from a stuck switch state to a low value (e.g., T_Low) (e.g., approximately 10 seconds) (at block 280).

As illustrated in FIG. 8B, in some embodiments, the recovery duration can be set to a default value (e.g., approximately 14 seconds) (at block 282) if the duration is not set to the high or the low value as described above.

As illustrated in FIG. 8C, after setting the duration used to detect recovery from stuck switch state, the switch controller 12 obtains the current duration of a low signal from the SSC switch 42 and compares the current duration to the set duration (at block 290). If the current duration satisfies (e.g., equals or exceeds) the set duration, the switch controller 12 detects that the SSC switch 42 is no longer stuck and has recovered (at block 292).

Returning to FIG. 4, the switch controller 12 also provides output to the driver regarding a state of the switches 40 and 42 (e.g., using a HMI and/or an EVIC included as part of an instrument panel or cluster) (at block 54). For example, the switch controller 12 can provide a text message (e.g., "HDC STUCK SWITCH" or "SSC STUCK SWITCH") on an EVIC screen. Alternatively or in addition, the switch controller 12 can activate and deactivate a dedicated lamp on an instrument cluster that provides a graphical indication of a switch state. Alternatively or in addition, the switch controller 12 can activate an audible message (e.g., a one-time short duration buzz or chime) that informs the driver of a stuck switch. Alternatively or in addition, the switch controller 12 can activate a tactile message (e.g., a one-time short duration vibration of the steering wheel, foot pedal, seat, etc.) that informs the driver of a stuck switch. In some embodiments, after successful recovery of a stuck switch, the HMI and/or EVIC can be re-set to inform the driver of the recovery.

Thus, embodiments of the invention provide, among other things, systems and methods for dynamically setting a parameter for detecting a stuck switch state based on current vehicle conditions. Current vehicle conditions can also be used to adapt parameters for detecting recovery of a stuck switch. The current vehicle conditions can be used to identify whether functionality associated with a switch has a great or low probability of being used or needed (e.g., when a vehicle is stationary and/or on a level surface, there is little need for hill speed control or off-road speed control).

Also, it should be understood that the systems and methods described above can be used for other switches than just the HDC switch 40 and the SSC switch 42. In particular, a controller can be configured to dynamically change detection parameters for any type of switch included in a vehicle (e.g., based on whether current vehicle condition increase or decrease the need or usefulness of the functionality associated with the switch). In addition, the methods and systems described above can be used to detect malfunctioning positions of other type of input mechanisms (e.g., a touchscreen, a rotating input mechanism, such as a dial, a sliding input mechanism, etc.). Also, it should be understood that the systems and methods described herein can be used to monitor driver-activated switches and input mechanisms and switches and input mechanisms mechanically or electrically activated. Also, the specific ranges and threshold described above are merely provided as examples and other ranges and thresholds are possible based on the functionality associated with a particular switch, the vehicle type, the vehicle location, the vehicle age etc.

It should also be understood that the driving conditions used by the switch controller 16 can be detected by the controller 16 or other devices included in the vehicle 10 (e.g., speed sensors, acceleration sensors, gear selection sensors, etc.). In situations where the switch controller 16 relies on other devices included in the vehicle 10 to detect these driving conditions, the switch controller 16 can receive the detected conditions directly from the devices or indirectly (e.g., over the CAN bus 16). In some embodiments, the switch controller 12 can also be configured to receive vehicle data (e.g., over the CAN bus 16) and process the data to generate current driving conditions (e.g., calculate vehicle acceleration from vehicle speed, etc.) used to set the switch monitoring parameters (e.g., stuck state duration and/or recovery duration).

Various features and advantages of the invention are set forth in the following claims.

What is claimed is:

1. A system for monitoring a switch included in a vehicle, the system comprising:
a controller configured to:
obtain at least one current driving condition,
dynamically generate at least one parameter for detecting a predetermined state of the switch based on the at least one current driving condition,
receive a signal from the switch,
compare the signal to the at least one parameter, and
determine a state of the switch when the signal satisfies the at least one parameter.

2. The system of claim 1, wherein the at least one current driving condition includes at least one selected from the group comprising vehicle speed, vehicle gear selection, vehicle yaw rate, and vehicle acceleration.

3. The system of claim 1, wherein the at least on parameter includes a duration for detecting a stuck state of the switch.

4. The system of claim 1, wherein the at least one parameter includes a duration for detecting recovery of a stuck state of the switch.

5. The system of claim 1, wherein the signal from the switch includes a high signal from the switch and the controller is configured to determine a duration of the high signal and compare the duration of the high signal to the at least one parameter.

6. The system of claim 1, wherein the signal from the switch includes a low signal from the switch and the controller is configured to determine a duration of the low signal and compare the duration of the low signal to the at least one parameter.

7. The system of claim 1, wherein the controller is further configured to provide output to a driver of the vehicle based on the determined state of the switch.

8. The system of claim 7, wherein the output includes at least one selected from the group comprising text output, graphical output, audible output, and tactile output.

9. The system of claim 1, wherein the switch includes a hill descent control switch.

10. The system of claim 9, wherein the controller is configured to
set the duration to a first value when a vehicle speed is greater than a predetermined value or when the vehicle is at a standstill and the vehicle is not on a slope, and
set the duration to a second value less than the first value when the vehicle speed is less than a predetermined value, a 4-wheel low gear of the vehicle is engaged, and a vehicle yaw rate is less than a predetermined value.

11. The system of claim 1, wherein the switch includes a speed select control switch.

12. The system of claim 11, wherein the controller is configured to
set the duration to a first value when a 4-wheel low gear of the vehicle is not engaged and when the vehicle is at a standstill or a vehicle speed is greater than a predetermined value and the vehicle is traveling on a level surface, and
set the duration to a second value less than the first value when at least one vehicle acceleration is consistent with off-road driving conditions, a vehicle raw rate is less than a predetermined value, and the vehicle is at a standstill or a vehicle speed is less than a predetermined value.

13. A method of monitoring a switch included in a vehicle, the method comprising:
- obtaining a current vehicle speed;
- dynamically, by a controller, generating a duration for detecting a stuck state of the switch based on at least the current vehicle speed;
- detecting, by the controller, a duration of a high signal received from the switch;
- comparing, by the controller, the duration of the high signal to the generated duration; and
- detecting, by the controller a stuck state of the switch when the duration of the high signal satisfies the generated duration.

14. The method of claim 13, further comprising:
- dynamically, by a controller, generating a second duration for detecting recovery from a stuck state of the switch based on at least the current vehicle speed;
- detecting, by the controller, a duration of a low signal received from the switch;
- comparing, by the controller, the duration of the low signal to the generated second duration; and
- detecting, by the controller a recovery from a stuck state of the switch when the duration of the low signal satisfies the generated second duration.

15. The method of claim 13, further comprising obtaining a current vehicle gear selection, a current vehicle yaw rate, and a current vehicle acceleration and generating the duration based on at least the current vehicle speed, the current vehicle gear selection, and the current vehicle acceleration.

16. The method of claim 13, further comprising providing output to a driver of the vehicle when the stuck state of the switch is detected, wherein the output includes at least one selected from the group comprising text output and graphical output.

17. The method of claim 13, further comprising providing output to a driver of the vehicle when the stuck state of the switch is detected, wherein the output includes audible output.

18. The method of claim 13, further comprising providing output to a driver of the vehicle when the stuck state of the switch is detected, wherein the output includes tactile output.

* * * * *

UNITED STATES PATENT AND TRADEMARK OFFICE
CERTIFICATE OF CORRECTION

PATENT NO. : 10,486,713 B2
APPLICATION NO. : 15/328821
DATED : November 26, 2019
INVENTOR(S) : Ankit Shah and Hirak Chanda Page 1 of 1

It is certified that error appears in the above-identified patent and that said Letters Patent is hereby corrected as shown below:

In the Claims

Column 12, Line 20 Claim 3: replace "at least on" with --at least one--

Column 12, Line 64 Claim 12: replace "vehicle raw rate" with --vehicle yaw rate--

Signed and Sealed this
Twenty-third Day of June, 2020

Andrei Iancu
*Director of the United States Patent and Trademark Office*